(12) United States Patent
Gudesen et al.

(10) Patent No.: US 6,380,553 B2
(45) Date of Patent: *Apr. 30, 2002

(54) MULTILAYER MATRIX-ADDRESSABLE LOGIC DEVICE WITH A PLURALITY OF INDIVIDUALLY MATRIX-ADDRESSABLE AND STACKED THIN FILMS OF AN ACTIVE MATERIAL

(76) Inventors: Hans Gude Gudesen, Tyrihansveien 5, N-1639 Gamle Fredrikstad; Per-Erik Nordal, Båstadryggen 19, N-1370 Asker, both of (NO)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/255,579

(22) Filed: Feb. 22, 1999

(30) Foreign Application Priority Data

Feb. 25, 1998 (NO) .................................................. 980781

(51) Int. Cl.$^7$ .......................... H01L 39/00; H01L 35/24; H01L 23/34
(52) U.S. Cl. ............................. 257/30; 257/40; 257/725
(58) Field of Search ............................. 257/30, 37, 40, 257/723, 724, 725, 726

(56) References Cited

U.S. PATENT DOCUMENTS

| | | | | |
|---|---|---|---|---|
| 4,939,568 A | * | 7/1990 | Kato et al. | |
| 5,612,570 A | * | 3/1997 | Eide et al. | 257/686 |
| 5,637,912 A | * | 6/1997 | Cockerill et al. | 257/620 |
| 5,675,180 A | * | 10/1997 | Pedersen et al. | 257/685 |

OTHER PUBLICATIONS

Article from the Norwegian Newspaper "Aftenposten" of Jun. 22, 1997 "Superkortet" (with English language translation thereof "The Supercard").

* cited by examiner

Primary Examiner—Ngân V. Ngô
(74) Attorney, Agent, or Firm—J. Harold Nissen; Lackenbach Siegel

(57) ABSTRACT

In a multilayer logic device or processor device with a plurality of individually matrix-addressable stacked thin layers of an active material, the active material in each layer is provided between a first electrode set and a second electrode set wherein the electrodes in the first set realize the columns and the electrodes in the second set the rows in an orthogonal array. The intersections between the electrodes in the array define logic cells in the layer of active material, and the stacked layers of active material are provided on a common supporting substrate. A separation layer with determined electrical or thermal properties is provided between each layer of active material.

10 Claims, 2 Drawing Sheets

MULTILAYER MATRIX-ADDRESSABLE LOGIC DEVICE WITH A PLURALITY OF INDIVIDUALLY MATRIX-ADDRESSABLE AND STACKED THIN FILMS OF AN ACTIVE MATERIAL

CROSS-REFERENCES TO RELATED APPLICATIONS (Not Applicable)

BACKGROUND OF THE INVENTION

1. Field of the Invention

The invention concerns a multilayer matrix-addressable logic device or processor device with two or more individually matrix-addressable stacked thin films of an active material which under the influence of an electric current or an electric field can attain two or more physically or chemically distinct detectable stable or metastable states wherein each are assigned respective logical values and which can transfer from a state of this kind to another, wherein the active material in each layer is provided between a first electrode set and a second electrode set which each comprises substantially mutually parallel striplike electrodes, such that the electrodes in the first electrode set constitute the columns and the electrodes in the second electrode set the rows in a substantially orthogonal array, wherein the intersections between the electrodes in the array defined logic cells in the layer of active material and wherein the stacked layers of active material is provided on a common supporting substrate.

2. Description of Related Art

From Norwegian patent application No. 972 803 filed on Jun. 17, 1997 which is assigned to the present applicant and hereby incorporated by reference, there is as shown in FIG. 1 known an electrically addressable passive device realized as a matrix-addressable device. A functional medium 1 is provided in the form of a plane layer S. The functional medium is an organic material with non-linear impedance characteristic and possible with different substances added in order to realize the desired detecting or switching functions. On the upper surface of the layer S lines for electrical addressing are provided in the form of a plurality of parallel electrical conductors m and on the lower surface of the layer S lines are correspondingly provided in the form of parallel electrical conductors n for electrical addressing, the conductors m,n being provided mutually orthogonal such that they form an array. In FIG. 1 the device is shown with x conductors m and y conductors n such that the conductors form an orthogonal x,y array. A logic cell 2 in the device is generated in the volume between two intersecting electric conductors m,n. This is emphasized in FIG. 1 by the formation of a logic cell $2_{k1}$ in the intersection between the k'th conductor m and the l'th conductor n.

FIG. 2 shows a section through a logic cell $2_{k1}$ of this kind according to the prior art. The opposite portions of the conductors $m_k$ and $n_1$ in an intersection together realize the electrode means $E_{k1}$ of the logic cell $2_{k1}$, as the anode 3 of the electrode means may be the conductor $m_k$ and the cathode 4 of the electrode means the conductor $n_1$.

For the purposes of the present invention the logic cell $2_{k1}$ could be denoted as a logic element, as the material in the functional medium 1 in the cell $2_{k1}$ on addressing can attain different physical and chemical states which may represent electrically detectable logical values. As further shown in FIG. 2, the functional medium 1 is provided as a portion of the layer S between the electrodes $m_k$, $n_1$, the anodes 3 and the cathodes 4 of the electrode device $E_{k1}$ being realized by the respective relevant portions of the conductor $m_k$ and the conductor $n_1$ in the intersection between the conductors. In this intersection, i.e. between the anode 3 and the cathode 4, a passive logic cell $2_{k1}$ is formed and denoted in this manner to indicate that it is provided between the conductor $m_k$ and the conductor $n_1$. FIG. 2 is, of course, only a section of FIG. 1 and it is to be understood that the whole section taken along the conductor $m_k$ will show a total of y logic cells 2 and y conductors $n_1$. If x≠y, the device, of course, forms a rectangular area with x,y logic cells and if x=y, the device is square with $x^2$ cells.

As shown in FIG. 1, the known device realizes a passive matrix, i.e. it can be addressed without using switching components in each cell or in each intersection, but for the purpose of the present application the matrix may also be of the active type, i.e. a switching element is including in each intersection and in each cell in the matrix. Active matrices of this kind which for instance employ transistors, are well-known in the art.

Applied as a memory medium, i.e. for storage of data, the functional medium 1, as shown in FIGS. 1 and 2 according to prior art, responds to electrical stimuli which effect a reversible or an irreversible change in the physical or chemical properties, which represents a given logical state, for instance a binary 1 or 0, and which can be detected by suitable means as the complex impedance between the electrodes or as the transmitting or reflecting optical properties of the memory medium or functional medium. Examples of reversible memory mediums which can be used in erasable and rewriteable memories are liquid crystals, metal-organic compounds, doped polymers and ferroelectric materials. Examples of irreversible memory materials which can be used in read only memories (ROM), or memories of the WORM type (Write Once Read Many Times) are polymers which are doped in order to obtain a controllable electrical rectification and conductance.

As shown in FIG. 1 or FIG. 2 and according to prior art the functional medium 1 may comprise one or more layers of active materials provided in a sandwich between the electrodes. Physically structures of this kind are realized on a substrate which may be rigid or flexible. Increased capacity may be obtained in a more compact embodiment, for instance by using thin substrates in the form of plastic films or strips and stacking these upon each other. However, the highest stacking density which is obtainable in this manner is restricted by a number of factors, among them the minimum practical substrate thickness. For the most relevant materials this will lie in a range of 1–10 μm.

BRIEF SUMMARY OF THE INVENTION

The object of the present invention hence is to be able to stack an array modules of the kind shown in FIG. 1 on a common substrate and sequentially provide a plurality of such array modules stacked one above the other, such that a stacked array configuration is obtained with an optimal given form factor which, apart from scale, is not changed by the number of stacked layers or array modules.

Further it is an object of the invention that the stacked array configuration may be given desired electrical, mechanical or thermal properties with regard to optimal functionality independent of the addressing mode.

According to the present invention the above objects and advantages are realized with a multilayer matrix-addressable logic device with two or more individually matrix-addressable stacked thin film of an active material, characterized in that a separation layer is provided between each layer of active material. Advantageously, the separation layer according to the invention is either electrically conducting or has high thermal conductivity.

Advantageously, the separation layer according to the invention may comprise a planarization material, the planarization material being provided in a separate planar layer integrated with the separation layer itself. The separation layer according to the invention may advantageously also be realised as a mechanical, thermal or thermo-mechanical oscillation damper.

Finally, the separation layer according to the invention may advantageously consist of respectively a metal, a metal alloy, a semiconductor, a carbonaceous material, diamond-like carbon or a nanocomposite.

The invention shall now be discussed in more detail with reference to the accompanying drawing wherein

DETAILED DESCRIPTION OF THE INVENTION

Figure 1:
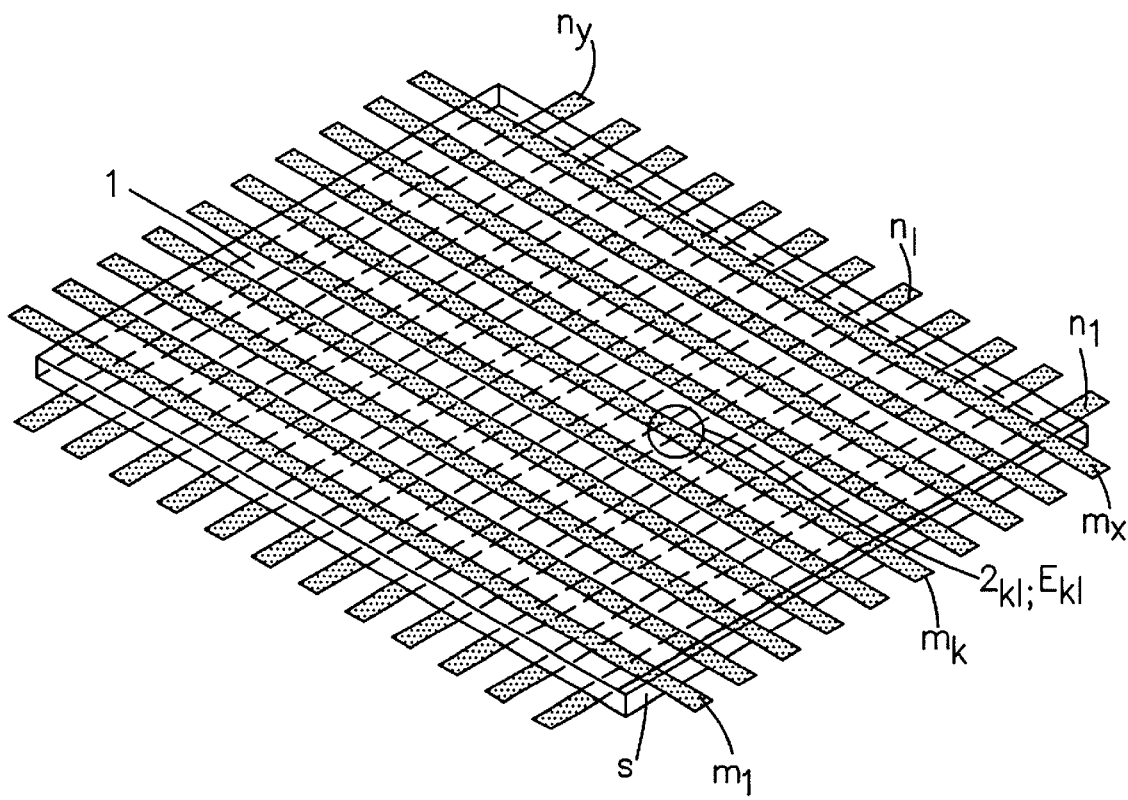
FIG. 1 shows a planar array module according to prior art.
Figure 2:
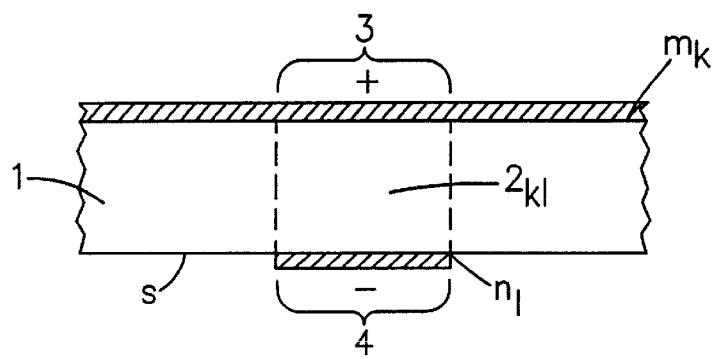
FIG. 2 a section through a logic cell in the array module in FIG. 1.
Figure 3:
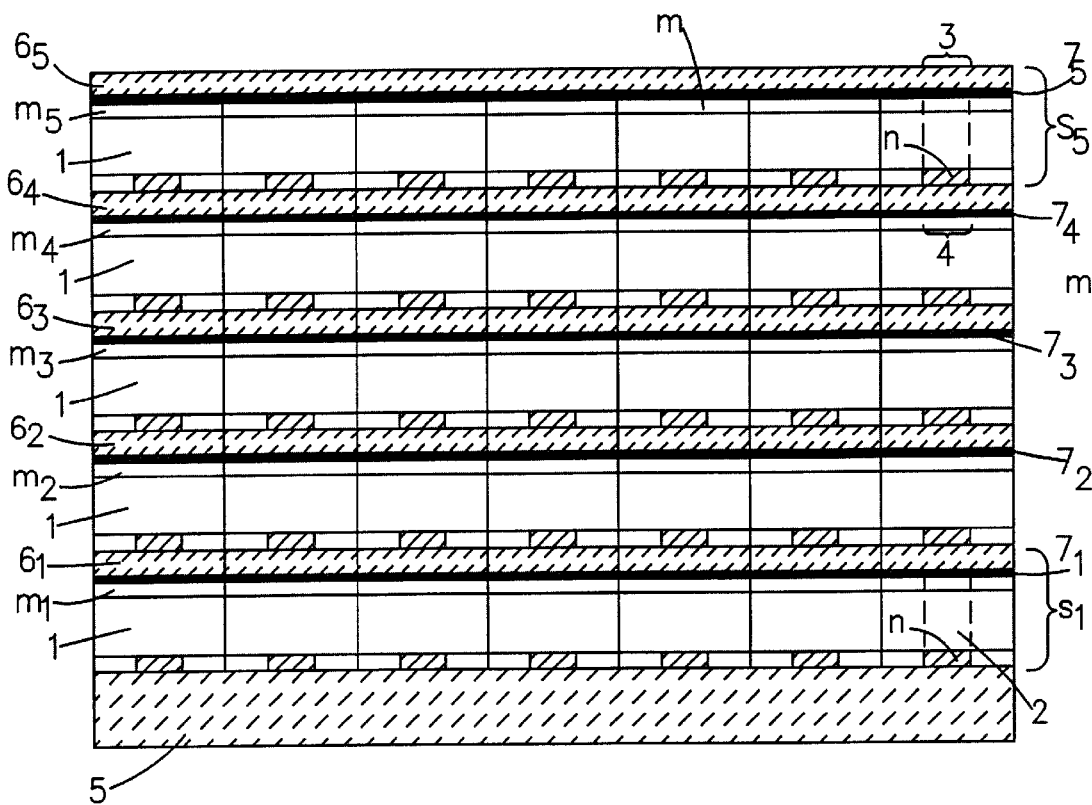
FIG. 3 shows a stacked structure of such planar array modules provided on a common substrate.

FIG. 3 shows a stacked structure of an array module according to the present invention and here specifically shown with five stacked array modules $S_1 \ldots S_5$, substantially realized as shown in FIG. 1. It is, however, to be understood that the number of stacked array modules is not restricted to five as will be evident from the following discussion. An array module $S_1$ is first formed on a suitable array 5 as shown. The array module comprises as known in the art a plurality of electrodes m,n, a functional medium 1 which well may be a memory medium in the form of an active material, and logic cells 2 defined in the logic medium 1 between an overlying portion 3 of the electrode m and underlying portion of the electrode n. Only one logic cell in the array module $S_1$ is shown and it is to be understood that the number of logic cells in an array is given by the product x·y, where x is the number of electrodes m and y the number of electrodes n. A corresponding number of logic cells 2 may, of course, be realized in each of the succeeding array modules $S_2, S_3, \ldots$ without that being specifically shown.

A further feature is that a dielectric isolation layer $7_1 \ldots 7_5$ is located between electrodes $M_1 \ldots M_5$ and separation layer $6_1 \ldots 6_5$. This provides for a dielectric isolation layer between array modules $S_1$ and $S_2$.

The array module corresponding to $S_1$ is formed on a suitably selected substrate 5. Thereafter a separation layer $6_1$ is globally provided on the top of the array module $S_1$ providing a separation which may be respectively mechanical, chemical, electrical, optical or thermal, possibly also a combination of such separation types between the lowermost array module $S_1$ and a succeeding array module $S_2$ which is provided on the top of the separation layer $6_1$. Now a separation layer $6_2$ is provided on the top of the array module $S_2$ and then follow in their turn further modules $S_3, S_4, \ldots$ with their respective separation layers $6_3, 6_4 \ldots$ until the stacked array configuration is obtained with as many array modules as is desirably or realistically attainable.

The array module also includes as a feature of the invention, a dielectric isolation layer 7 located between electrode m and separation layer 6.

The deposition of the separate layers, irrespective of whether they are separation layers, electrode layers or functional medium layers which together form each separate array module $S_1, S_2$ and finally, the whole stacked or volumetric configuration as shown in FIG. 3, may be realized by means of a number of different methods, for instance by deposition by doctor blading, dipping, spin coating, brushing, selfassembly sputtering, evaporation and ablation. A number of such deposition methods will be compatible with high volume production processes wherein strip-like materials are used in a reel-to-reel approach.

The realized volumetric array configuration as shown in FIG. 3, is particularly advantageous in regard of realizing high volumetric density, on the condition that each separate array module $S_1, S_2, \ldots$ is very thin. Array modules which are used with polymer-based functional media in memory materials, will typically have a thickness less than 1 $\mu$m and it will hence at least theoretically be possible to stack up to 1000 array modules per mm, if the separation layers also are thin, i.e. have a thickness in the submicrometer range. It is for instance technically possible to realize separation layers in thin film technology and with a thickness less than 100 nm.

The lower most module includes the dielectric isolation layer $7_1$ between electrode $M_1$ and separation layer $6_1$.

As known in the art the separation layer may correspond to the use of electrical isolating layers between the array modules $S_1, S_2$ such as is known from the prior art according to the above-mentioned Norwegian patent application. Hence there is nothing against providing separation layers in connection with isolation layers or possibly combining layers of this kind.

According to the present invention the separation layers can, however, be distinctly different from possible electrical isolating layers and formed by a great number of materials. In a volumetric stacked structure according to the invention as shown in FIG. 3, a number of advantageous properties may be obtained which are not immediately connected to the electric properties of the array modules, such these latter for instance appear in connection with addressing with logic operations and storage of data in mind.

A potential problem with a volumetric stacked array configuration wherein the logic cells are arranged with high density, is the occurrence of an unacceptable temperature rise due to the dissipation of electric energy in connection with addressing and processing operations in the separate array module or simultaneously in several array modules, as a great number of logic cells which is provided in an array of this kind, of course, advantageously may be addressed simultaneously or in massive parallelism.

This energy dissipation may be avoided by using separation layers having good thermal conductivity. This implies that metals such as copper, aluminium or silver may be relevant in this connection, but also thin films of diamond or diamond-like carbon or carbon nanocomposites may according to the invention be preferable due to their extremely high thermal conductivity and possibility of depositing them at low to moderate substrate temperatures. Certain nanocomposites also have a very high electrical conductance and this may be exploited with electrical shielding for eliminating cross talk between the separate array modules $S_1, S_2$, in mind. Of course, separation layers of metals, for instance the above-mentioned, or different metal alloys may provide a shielding of this kind.

Another potential problem with the application of volumetric stacked array configurations as shown in FIG. 3, is cross talk between the separate array modules $S_1, S_2 \ldots$ due to acoustic or mechanical coupling. Certain types of active materials used for storage or processing purposes respond to electrical stimuli, for instance of electrostrictive, piezoelectric or electrochemical nature etc. with a dimensional change. Hence a mechanical shock may propagate from a point within the volumetric configuration, being picked up by a mechano-electrical conversion in another point and generate an array signal which may cause interference. In order to avoid this it is according to the invention hence preferred that a separation layer is realized as a mechanical, thermal or thermo-mechanical oscillation damper.

Finally it is also a problem in the manufacture of stacked array modules as shown in FIG. 3 that microscopic irregularities or unevenly thick layers cause a diminishing degree of planarity in the successively deposited layers, which in its turn may cause in sum regarded a distorted structure. Corresponding problems are known from common electronic technology, for instance the realization of integrated circuits on a substrate, where the integrated circuits comprise several layers which, however, are included in the same functional application in the circuits, but wherein the problem with missing planarity yet may be desirable to avoid. It is well-known to provide a planarization layer which with a precisely controlled thickness is deposited on the layer that is to be planarized and levels thickness variations or distortions therein. According to the present invention the separation layer may preferably comprise a planarization material which is admixed to the layer in the deposition which is performed under such physical conditions, for instance of thermal nature, that planarization takes place. The planarization material may also be provided in a separate layer which is integrated planar with the separation layer in a particular and carefully controlled deposition process on the top of the separation layer before the next array module is deposited.

What is claimed is:

1. A multilayer matrix-addressable logic device or processor device with two or more individually matrix-addressable stacked thin film of an active material which under the influence of an electric current or an electric field can attain two or more physically or chemically distinct detectable stable metastable states wherein each are assigned respective logical values and which can transfer from a state of this kind to another, wherein the active material in each layer is provided between a first electrode set and a second electrode set wherein each comprises substantially mutually parallel striplike electrodes, such that the electrodes in the first electrode set constitute the rows in a substantially orthogonal array, wherein the intersections between the electrodes in the array define logic cells in the layer of active material and wherein the stacked layers of active material are provided on a common supporting substrate, and including:
   a separation layer between each of said adjacent stacked layers of active material, whereby to provide a stacked array of modules on the common substrate and sequentially provide a plurality of such array of modules stacked one above the other with the material from which the separation layer is formed being conductive and providing separations.

2. A device according to claim 1, wherein the separation layer is electrically conducting.

3. A device according to claim 1, wherein the separation layer has high thermal conduction.

4. A device according to claim 1, wherein the separation layer comprises a planarization material.

5. A device according to claim 4, wherein the planarization material is provided in a separate planar layer integrated with the separation layer itself.

6. A device according to claim 1, wherein the separation layer is realized as a mechanical, thermal or thermomechanical oscillation damper.

7. A device according to claim 1,
   wherein the separation layer consists of a metal, a metal alloy, a carbonaceous material, a diamond-like carbon or a nanocomposite.

8. A multilayer matrix-addressable logic device or processor device with two or more individually matrix-addressable stacked thin film of an active material which under the influence of the electric current or an electric field can attain two or more physically or chemically distinct detectable stable metastable states wherein each are assigned respective logical values and which can transfer from a state of this kind to another, wherein the active material in each layer is provided between a first electrode set and a second electrode set wherein each comprises substantially mutually parallel striplike electrodes, such that the electrodes in the first electrode set constitute the rows in a substantially orthogonal array, wherein the intersections between the electrodes in the array define logic cells in the layer of active material and wherein the stacked layers of active material are provided on a common supporting substrate, and including:
   a separation layer between each of said adjacent stacked layers of active material, said material being an electrically conducting material or has high thermal conductivity or a planarization material provided in a separate planar layer integrated with the separation layer itself, or a mechanical, thermal or thermo-mechanical oscillation damper, and the properties of the material consists of a metal, a metal alloy, a semiconductor, a carbonaceous material, diamond-like carbon or a manocomposite.

9. The device according to claim 8, and a stacked array of modules is provided on the common substrate and sequentially provide a plurality of such array of modules stacked one above the other with the material from which the separation layer is formed being conductive.

10. A multilayer matrix-addressable logic device or processor device with two or more individually matrix-addressable stacked thin film of an active material which under the influence of the electric current or an electric field can attain two or more physically or chemically distinct detectable stable metastable states wherein each are assigned respective logical values and which can transfer from a state of this kind to another, wherein the active material in each layer is provided between a first electrode set and a second electrode set wherein each comprises substantially mutually parallel striplike electrodes, such that the electrodes in the first electrode set constitute the rows in a substantially orthogonal array, wherein the intersections between the electrodes in the array define logic cells in the layer of active material and wherein the stacked layers of active material are provided on a common supporting substrate, and including:
   a separation layer between each of said adjacent stacked layers of active material, said material being an electrically conducting material or having a high thermal conductivity or a planarization material provided in a separate planar layer integrated with the separation layer itself, or a mechanical, thermal or thermo-mechanical oscillation damper, and the properties of the material consists of a metal, a metal alloy, a semiconductor, a carbonaceous material, diamond-like carbon or a monocomposite.

* * * * *